United States Patent
Kim et al.

(10) Patent No.: US 6,636,115 B2
(45) Date of Patent: Oct. 21, 2003

(54) AMPLIFIER AND MIXER WITH IMPROVED LINEARITY

(75) Inventors: Bonkee Kim, Kyeongki-Do (KR); Kwyro Lee, Daejon (KR)

(73) Assignee: Integrant Technologies Inc., Kyeongki-Do (KR)

( * ) Notice: Subject to any disclaimer, the term of this patent is extended or adjusted under 35 U.S.C. 154(b) by 0 days.

(21) Appl. No.: 09/942,573

(22) Filed: Aug. 31, 2001

(65) Prior Publication Data

US 2002/0113650 A1 Aug. 22, 2002

(30) Foreign Application Priority Data

Feb. 16, 2001 (KR) ................................ 10-2001-0007857

(51) Int. Cl.[7] ................................................ H04B 1/38
(52) U.S. Cl. ....................................... 330/254; 327/359
(58) Field of Search ......................... 327/359; 330/254, 330/285, 311, 295, 296, 124 R

(56) References Cited

U.S. PATENT DOCUMENTS

| | | | | |
|---|---|---|---|---|
| 5,763,921 A | * | 6/1998 | Okumura et al. | 257/371 |
| 5,796,306 A | * | 8/1998 | Tsumura | 330/124 R |
| 5,903,854 A | * | 5/1999 | Abe et al. | 330/124 R |
| 6,026,286 A | | 2/2000 | Long | 455/327 |
| 6,331,804 B1 | * | 12/2001 | Shimizu et al. | 330/124 R |

FOREIGN PATENT DOCUMENTS

| KR | 1998-0068703 | 10/1998 |
|---|---|---|

OTHER PUBLICATIONS

Bonkee Kim, Jin–Su Ko, and Kwyro Lee, "New Linearization Technique of Mosfet RF Amplifier Using Multiple Gated Transistors," *IEEE Microwave and Guided Wave Letters*, vol. 10, No. 9, Sep. 2000, pp. 371–373.

Bonkee Kim, Abstract to thesis entitled "High Linear CMOS RF Amplifier Using Transconductance Nonlinearity Cancellation and its Volterra Series Analysis," Department of Electrical Engineering & Computer Science at Korea Advanced Institute of Science and Technology, Nov. 11, 2000.

* cited by examiner

*Primary Examiner*—Timothy P. Callahan
*Assistant Examiner*—Linh Nguyen
(74) *Attorney, Agent, or Firm*—Foley & Lardner

(57) ABSTRACT

The present invention relates to the improvement of linearity of active devices, which can be degraded by the transconductance thereof. According to the present invention, an amplifier circuit is provided, which comprises: a main active device having first, second, and third terminal, wherein quantity and direction of current flowing from the second terminal to the third terminal is varying in dependant on voltage driven to the first terminal; an auxiliary active device having first, second, and third terminal, wherein quantity and direction of current flowing from the second terminal to the third terminal is varying in dependant on voltage driven to the first terminal; and a biasing unit connected to the first terminals of the main and auxiliary active devices, the third terminals of the main and auxiliary active devices, voltage source, an input terminal, and an output terminal, by which each of the main and auxiliary active devices operates primarily in saturation region and sub-threshold region, respectively.

18 Claims, 13 Drawing Sheets

AMPLIFIER AND MIXER WITH IMPROVED LINEARITY

FIELD OF THE INVENTION

The present invention relates to an amplifier circuit and a mixer circuit. More specifically, the present invention relates to the improvement of linearity of active devices, which can be degraded by the trans-conductance thereof.

BACKGROUND OF THE INVENTION

As RF amplifier is integrated into a transceiver chip, the linearity requirement per unit DC power consumption is getting more stringent.

Generally, in the CDMA (Code Division Multiple Access) communications, a transmitter and a receiver are isolated by means of a duplexer. Because the maximum output power reaches up to 28 dBm while a duplexer can attenuates only around 40 dB, the spurious signals of transmitter act as main interference source. Occasionally, these signals appear in receive band by means of either inter-modulation or cross-modulation. This is the most outstanding reason which caused the recent stringent linearity requirement for LNA (Low Noise Amplifiers).

Various solutions for improving the linearity of amplifiers have been developed especially in system level. Among the solutions, there are pre-distortion, feed-forward, Cartesian feedback, and so on. However, those solutions require complex hardware. Therefore, while those solutions may be employed in a large system such as a base station, they are not suitable to be employed in a small system such as a handset.

Until now, linearization techniques have been mostly applied to power amplification field. However, because of the above reasons, linearization of other RF circuit blocks are required. As LNAs, mixers and driver amplifiers are being integrated in one-chip, the linearity itself and linearity per unit DC power consumption becomes important figure of merit for a circuit block.

SUMMARY OF THE INVENTION

An object of the invention is to provide an amplifier circuit having a active device, whose linearity is improved.

Another object of the invention is to provide an amplifier circuit whose non-linearity due to trans-conductance of active devices is suppressed.

Further object of the invention is to provide a Cascode type amplifier circuit whose non-linearity due to trans-conductance of active devices is suppressed.

Still further object of the invention is to provide a mixer circuit whose non-linearity due to trans-conductance of active devices is suppressed.

In order to accomplish the objects, the present invention provides an amplifier circuit comprising: a main active device having first, second, and third terminal, wherein quantity and direction of current flowing from the second terminal to the third terminal varies depending on voltage driven to the first terminal; an auxiliary active device having first, second, and third terminal, wherein quantity and direction of current flowing from the second terminal to the third terminal is varies depending on voltage driven to the first terminal; a main biasing unit connected to the first terminal of said main active device, the third terminal; of said main active device, voltage source, an input terminal, and an output terminal, by which said main active device operates primarily in a saturation region; and an auxiliary biasing unit connected to the first terminal of said auxiliary active device, the third terminal of said auxiliary active device, voltage source, an input terminal, and an output terminal, by which said auxiliary active device operated primarily in a sub-threshold region.

According to another aspect of the present invention, a compensation circuit for compensating non-linearity of a main active device having first, second, and third terminal, wherein quantity and direction of current flowing from the second terminal to the third terminal is varying in dependant on voltage driven to the first terminal, is provided. The compensation circuit comprises: an auxiliary active device having first, second, and third terminal, wherein quantity and direction of current flowing from the second terminal to the third terminal is varying in dependant on voltage driven to the first terminal; and a biasing unit connected to the first terminal of the auxiliary active device, the third terminal of the auxiliary active device, voltage source, an input terminal, and an output terminal, by which the auxiliary active device operates primarily in sub-threshold region under condition that the main active device operates primarily in saturation region.

According to further aspect of the present invention, an amplifier circuit is provided, which comprises: first and second main active devices having first, second, and third terminal, wherein quantity and direction of current flowing from the second terminal to the third terminal is varying in dependant on voltage driven to the first terminal, and the first and second active devices are serially coupled such that the third terminal of the first active device is coupled to the second terminal of the second active device; an auxiliary active device having first, second, and third terminal, wherein quantity and direction of current flowing from the second terminal to the third terminal is varying in dependant on voltage driven to the first terminal, and the third terminals of the first main active device and the auxiliary active device are connected; and a biasing unit connected to the first terminals of the first and second main active devices, the first terminal of the auxiliary active devices, the third terminal of the second main active device, voltage source, an input terminal, and an output terminal, by which the first and second main active devices operate primarily in saturation region and the auxiliary active device operates primarily in sub-threshold region.

According to still further aspect of the present invention, a mixer circuit is provided, which comprises: a main active device having first, second, and third terminal, wherein quantity and direction of current flowing from the second terminal to the third terminal is varying in dependant on voltage driven to the first terminal, an active device pair comprising two active devices having first, second, and third terminal, wherein quantity and direction of current flowing from the second terminal to the third terminal is varying in dependant on voltage driven to the first terminal, and wherein the first active device and the active device pair is serially coupled such that the third terminal of the first active device is coupled to the second terminals of the active devices in the active device pair; an auxiliary active device having first, second, and third terminal, wherein quantity and direction of current flowing from the second terminal to the third terminal is varying in dependant on voltage driven to the first terminal, and the third terminals of the first main active device and the auxiliary active device are connected; and a biasing unit connected to the first terminals of the main active device and the active devices in the active device pair, the first terminal of the auxiliary active device, voltage source, an input terminal, and an output terminal, by which the main active device operates primarily in saturation region and the auxiliary active device operates primarily in sub-threshold region.

DETAILED DESCRIPTION OF PREFERRED EMBODIMENTS

Figure 1:
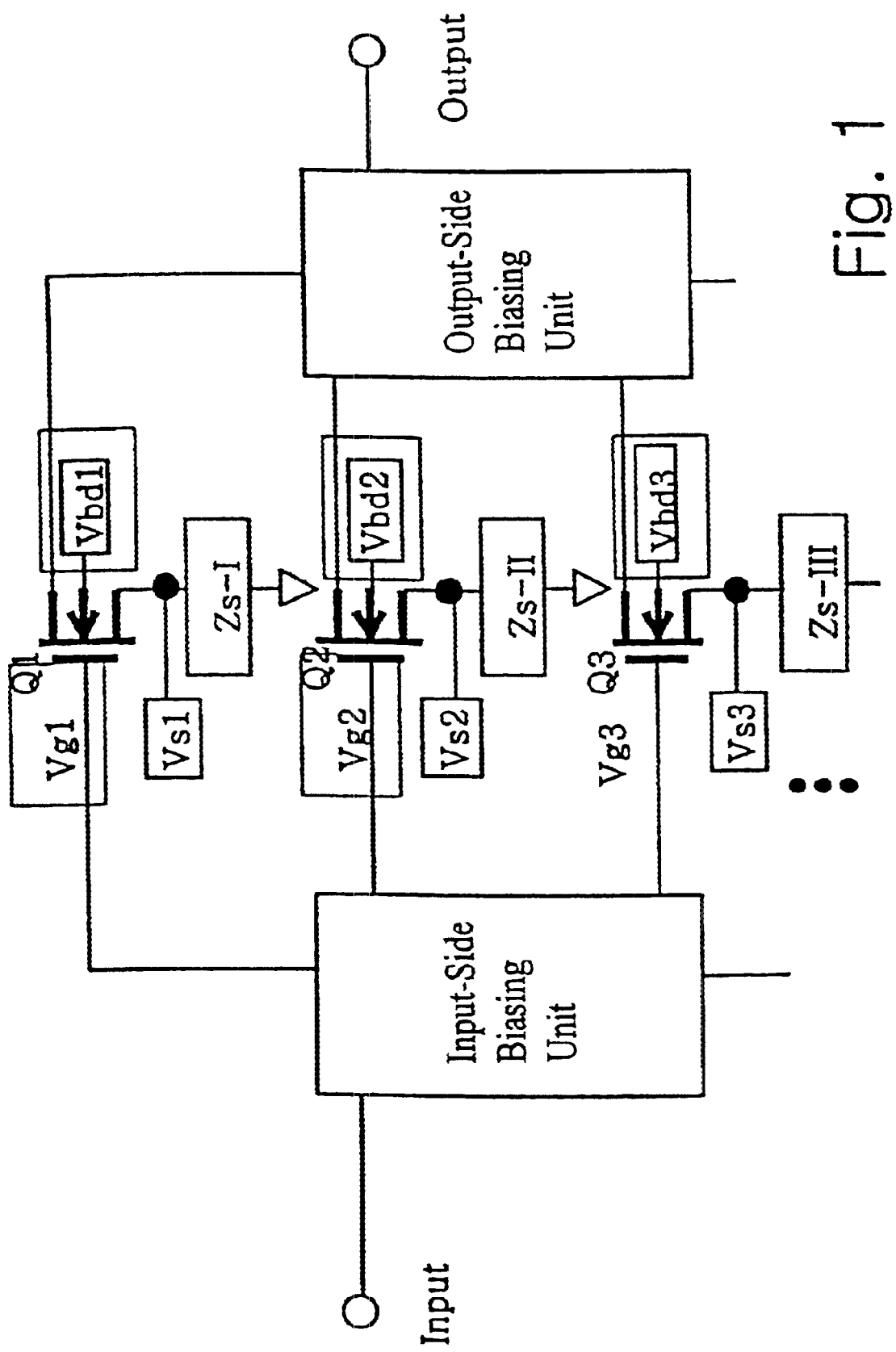
FIG. 1 shows a circuit diagram illustrating an amplifier circuit having linearity which is improved in accordance with the present invention.

FIG. 1 shows a circuit diagram illustrating an amplifier circuit having linearity which is improved in accordance with the present invention.

The amplifier circuit having improved linearity in accordance with the present invention, utilizes at least two active devices (Qn). Each of the active devices (Qn) has gate (gn), source (sn), and drain (dn). The active device (Qn) has a characteristic that the current flowing from the source (sn) to drain (dn) and vice versa has its quantity and direction which is varying in dependant on the voltage driven to the gate (gn) or the voltage between the gate (gn) and source (sn). The active device comprises conventional Bi-polar Junction Transistors (BJT), Junction Field Effect Transistors (JFET), Metal-Oxide Semiconductor Field Effect Transistors (MOSFET), and Metal Semiconductor Field Effect Transistors (MESFET).

The active device may additionally have body (bn) terminal. Threshold voltage (Vth) for the active device is variant dependant on the body terminal. In this way, quantity and direction of the current flowing from the source (sn) to the drain (dn) and vice versa is dependant on the voltage between the gate (gn) and the body (bn) terminal. Among such an active device having body terminal, there is MOSFET.

Hereinafter, it will be set forth the description on the examples and embodiments applied to the MOSFET. However, the scope and idea of the present invention can be applied to other active devices which can be used as an amplifier. Therefore, the concept and scope of the present invention should not be limited to the described examples and embodiments which are based on MOSFETs.

As illustrated in FIG. 1, the amplifier circuit according to the present invention, comprises N active devices (Qn) and N source-side impedance units (Zsn). Each of source-side impedance units is connected between each source (sn) of N active devices (Qn) and ground, respectively. Source-side impedance units (Zsn) should be interpreted in a broad sense such that the impedance value includes real and complex value. Moreover, source-side impedance units (Zsn) can have their impedance value of 0 or infinite.

An input terminal is connected to the gate terminals of N active devices (Qn). Gate terminals are connected to a power source through at least a biasing unit.

An input-side biasing unit can be provided between the input terminal and the gate terminals. Each gate terminal is maintained at biasing voltage which can make each active device (Qn) be operated in a desired operation region. Preferably, the input-side biasing unit can be separated into a plurality of sub-units. Each of the sub-units is connected to each of the gate terminals, respectively. Each of the sub-units, being supplied from voltage source, acts to adjust biasing voltage at each gate terminals.

Source voltage (Vsn) and body voltage (Vbn) is driven to source and body terminal of each active device (Qn). In accordance with a preferred embodiment, a biasing unit is connected between the source of each active device (Qn) and the power source. Also, a biasing unit is connected between the body terminal of each active device (Qn) and the power source. The biasing units connected between the source and the power source, and between the body terminal and the power source, adjust the voltage at source (Vsn) and body terminal (Vbn). In the specification, these biasing units for adjusting the source voltage (Vsn) and the body voltage (Vbn) are called operating point biasing units.

Drains of N active devices (Qn) are connected to an output terminal. A biasing unit can be connected between each drain of N active devices (Qn) and the output terminal, as shown in FIG. 1. The biasing unit connected between a drain and the output terminal is called output-side biasing unit.

In the embodiment of FIG. 1, the first active device (Q1) mainly amplifies signal from the input terminal. The amplified signal is output to the output terminal. Active devices other than the first active device (Q1), i.e., the second, third, and the other active devices (Q2, Q3, and Q4, . . . ) mainly act to attenuate the non-linearity of the first active device (Q1). In the specification, the first active device (Q1 ), which mainly acts to amplify signal from the input terminal, is called a main active device. On the other hand, the other active device, which mainly acts to attenuate the non-linearity of the main active device, is called an auxiliary active device.

More specifically, the auxiliary active device acts to compensate non-linearity in the operating region where second-order derivative of trans-conductance (gm") of the main active device shows non-linear characteristic with respect to voltage between gate and source.

FIG. 1 is illustrated such that the first active device (Q1) is mainly used for amplification while the other active devices (Q2, Q3, and . . . ) is mainly used for compensating the non-linearity of the first active device (Q1). However, the idea and concept of the present invention should not be limited to the example shown in FIG. 1. More than two active devices may be used for the amplification. Further, a plurality of active devices may compositely operate for the amplification or the compensation.

In the specification, an active device, which acts mainly for the amplification operation, such as, the first active device (Q1) of FIG. 1, is called the main active device. An active device, which acts mainly for the attenuation of the non-linearity of the main active device, such as, the active devices (Q2, . . . ) other than the first active device (Q1) in FIG. 1, is called the auxiliary active device. Furthermore, with respect to the circuitry relating to the main active device, the circuitry comprising and relating to the auxiliary active devices for the compensation of the non-linearity of the main active device together with biasing circuits of the auxiliary active devices, is called the compensation circuit.

In the embodiment of FIG. 1, it is preferred that the main active device operates primarily in the saturation region. The input-side and output-side biasing units can be designed such that the main active device (Q1) operates substantially in the saturation region. Although the biasing units are designed such that the main active device (Q1) operates in the saturation region, the main active device (Q1) may possibly operates in either linear or cutoff region according to the level of input signal.

It is also preferred that the auxiliary active devices operate primarily in the sub-threshold region. Preferably, the input-side and output-side biasing units can be designed such that the auxiliary active device (Q2) operates substantially in the sub-threshold region. Although the biasing units are designed such that the auxiliary active device (Q2) operates in the sub-threshold region, the auxiliary active device (Q2) may possibly operates in either saturation or, even, linear region according to the actual characteristic of the active devices.

According to a further embodiment of the present invention, the input-side biasing unit may be composed of a main biasing unit and an auxiliary biasing unit, each of which is for biasing each of the main and auxiliary active devices (Q1 and Q2), respectively. The output-side biasing unit may also be composed of a main biasing unit and an auxiliary biasing unit, each of which is for biasing each of the main and auxiliary active devices (Q1 and Q2), respectively.

When a main active device (Q1) acts as an amplification stage, non-linearity in the amplification is caused mostly by non-linearity of trans-conductance (gm) of the main active device (Q1).

When input signal having two frequency components of f1 and f2 is driven to a non-linear circuit, it can be easily appreciated that signal components having frequency of 2×f1, 2×f2, f1−f2, f1+f2, 3×f1, 3×f2,2×f1−f2, 2×f2−f1, 2×f1+f2, 2×f2+f1, and so on, are generated in addition to components of f1 and f2, due to the non-linearity of the circuit.

In general, most of the generated components are located far from the original components of f1 and f2 in frequency domain. Therefore, they may be attenuated or suppressed by filtering. Nevertheless, those components, such as, those having frequency of 2×f1−f2 and 2×f2−f1, which are located in the neighborhood of the original components in frequency domain, cannot be easily suppressed by filtering. Those components having frequencies close to the frequency of the original component in an original channel, may interfere with another signal in the near channel, whose frequency is close to that of the original channel, i.e., inter-channel interference. Otherwise, those components having frequencies close to the frequency of the original component may interfere with each other in the same channel, i.e., in-channel interference.

Those components having frequency, which is close to the original component, are called $3^{rd}$ order inter-modulation distortion (IMD3) component. In general, linearity of a circuit can be expressed by ratio of quantity of IMD3 and degree of amplification. The value, which expresses linearity of a circuit by ratio of quantity of IMD3 and degree of amplification, is called $3^{rd}$ order intercept point (IP3).

In FIG. 1, drain current of main active device (Q1) can be expressed by polynomial approximation of gate to source voltage (Vgs) with derivatives of trans-conductance (gm) being coefficients of terms in the polynomial, as defined by Eqn. 1.

$$i_{DS} = I_{DC} + g_m v_{gs} + \frac{g'_m}{2!} v_{gs}^2 + \frac{g''_m}{3!} v_{gs}^3 + \ldots \quad \text{(Eqn. 1)}$$

In Eqn. 1, coefficient of third order term ($Vgs^3$) in the polynomial is second order derivative of trans-conductance (gm) with respect to gate to source voltage of the active device, i.e., gm". It is known in the art that gm" affects IMD3 and IP3.

Figure 6:
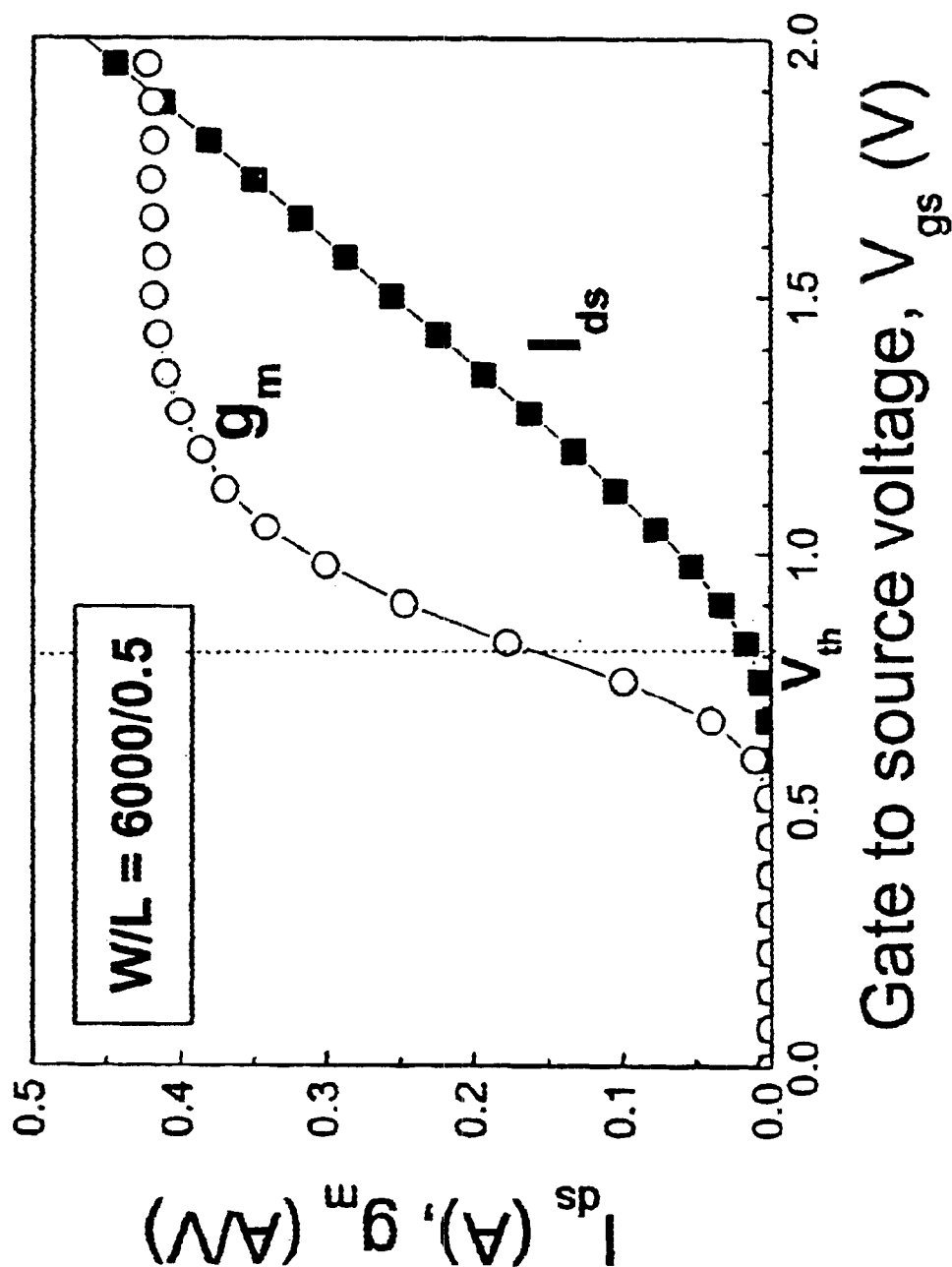
FIG. 6 shows a graph illustrating drain current (Ids) and trans-conductance (gm) with respect to gate to source voltage (Vgs), for an exemplary real active device having width to length ratio (W/L) of 6000/0.5 ($\mu$m).
Figure 7:
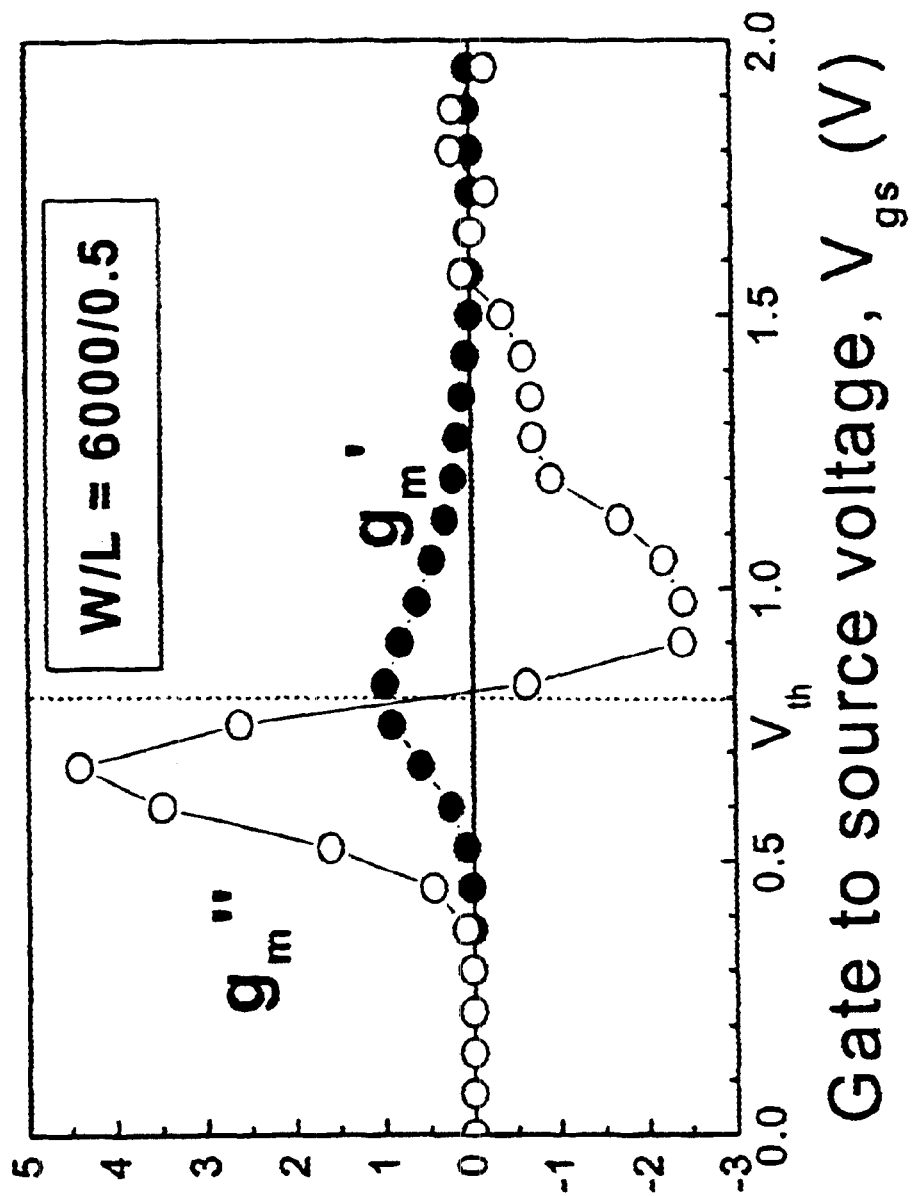
FIG. 7 shows a graph illustrating first and second order derivatives (gm' and gm") of trans-conductance (gm) with respect to gate to source voltage (Vgs), for an exemplary real active device having width to length ratio (W/L) of 6000/0.5 ($\mu$m).

FIG. 6 shows a graph illustrating drain current (Ids) and trans-conductance (gm) with respect to gate to source voltage (Vgs), for an exemplary real active device having width to length ratio (W/L) of 6000/0.5 ($\mu$m). FIG. 7 shows a graph illustrating first and second order derivatives (gm' and gm") of trans-conductance (gin) with respect to gate to source voltage (Vgs), for an exemplary real active device having width to length ratio (W/L) of 6000/0.5 ($\mu$m).

As one can easily acknowledge from FIG. 7, the second order derivative (gm") of the trans-conductance has positive maximum value at a point within a region, where gate to source voltage (Vgs) is lower than the threshold voltage (Vth). The region where gate to source voltage (Vgs) is lower than the threshold voltage (Vth) is called the sub-threshold region. Further, the second order derivative (gm") becomes 0 near the point where gate to source voltage (Vgs) is equal to the threshold voltage (Vth). The second order derivative (gm") has negative minimum value at a point with a region, where gate to source voltage (Vgs) is larger than the threshold voltage (Vth).

It is preferred that the active device (Q1) acquires trans-conductance value high enough such that the trans-conductance value is substantially the same as the value, to which the trans-conductance of the active device (Q1) converges as the gate to source voltage is increased. At the same time, it is preferred that the active device (Q1) flows relatively small amount of current and, thereby, it consumes relatively low DC power. In order to accomplish these, it is preferred that the main active device (Q1) operates near a region where the value which is resulted by subtracting the threshold voltage (Vth) from gate to source voltage (Vgs), i.e., Vgs–Vth, is within a range of 0.1 V to 0.4 V.

Typically, the region where value, which is resulted by subtracting the threshold voltage (Vth) from gate to source voltage (Vgs), is within a range of 0.1 V to 0.4 V, is within the saturation region. However, as shown above, the second order derivative (gm") of trans-conductance has negative minimum value at that region, which means that non-linearity of the active device (Q1) becomes maximal. Therefore, unfortunately, the active device (Q1) shows maximal non-linear characteristic at the region where relatively large RF power is obtained while, at the same time, relatively small DC power is consumed. This is due to the negative minimal characteristic of the second order derivative (gin") of trans-conductance at that region.

According to the present invention, the negative minimal characteristic of the second order derivative (gm") of the main active device (Q1) can be compensated by adjusting an auxiliary active device (Q2) such that the second order derivative (gm") of trans-conductance of the auxiliary active device (Q2) has positive maximum value at the region where the second order derivative (gm") of trans-conductance of the main active device (Q1) shows negative minimal characteristic. In other words, in the region where high RF power gain and low DC power consumption is obtained, the non-linearity of the main active device (Q1) due to negative minimal of second order derivative (gm") of trans-conductance can be attenuated by compensating the negative minimal characteristic with the positive maximal characteristic of the second order derivative (gm") of trans-conductance of the auxiliary active device (Q2).

The compensation of the negative minimal characteristic of the main active device (Q1) can be accomplished by biasing the auxiliary active device (Q2) such that the auxiliary active device (Q2) shows positive maximal characteristic in its second order derivative (gm") of trans-conductance at the region where the main active device (Q1) shows negative minimal characteristic.

More specifically, when the main active device (Q1) is biased at a predetermined value of gate to source voltage (Vgs), the compensation of the non-linearity of the main active device (Q1) may be accomplished by biasing the second active device (Q2) such that gate to source is at voltage value which is resulted by subtracting the first predetermined voltage (Vb1) from the gate to source voltage (Vgs) of the main active device (Q1), i.e., Vgs –Vb1. In this manner, the characteristic of the first active device (Q1) that negative minimal point is appear in the second order derivative (gm") of trans-conductance, can be attenuated by using the characteristic of the second order derivative (gm") of the trans-conductance of the second active device (Q2). In the specification, the above-mentioned first predetermined voltage (Vb1), which represents the value to be subtracted from the biasing voltage of the main active device (Q1) in order to determine the biasing voltage for the auxiliary active device (Q2), is called the first compensation biasing voltage of the auxiliary active device.

Preferably, both of the main and auxiliary active devices (Q1 and Q2) are MOSFETs. When N-type MOSFETs are used for the active devices, the first compensation biasing voltage (Vb1) has positive value. Contrarily, when P-type MOSFETs are used for the active devices, the first compensation biasing voltage (Vb1) should be negative.

Hereinafter, method for determining biasing voltage for an auxiliary active device is described.

The relationship among gate to source biasing voltages (Vgs and Vgs2) for a main active device and an auxiliary active device and the first compensation biasing voltage (Vb1) corresponds to Eqn. 2.

$$Vgs2 = Vgs - Vb1$$

In accordance with an embodiment of the present invention, the first compensation biasing voltage (Vb1) for attenuating non-linearity of the main active device may be determined in such a way that integral of sum of the second order derivative (gm") of trans-conductance of the main active device and the second order derivative (gm") of trans-conductance of the second active device throughout the operation region with respect to gate to source voltage, is minimized.

According to another embodiment of the present invention, the first compensation biasing voltage (Vb1) may be determined in such a way that integral of absolute or square of sum of the second order derivative (gm") of trans-conductance of the main active device and the second order derivative (gm") of trans-conductance of the second active device throughout the operation region in the characteristic graph is minimized.

According to a further embodiment of the present invention, the first compensation biasing voltage (Vb1) may be determined in such a way that the auxiliary active device is biased at a gate to source voltage value at a point where the second order derivative (gm") of trans-conductance of the auxiliary active device has positive maximum value.

Figure 8:
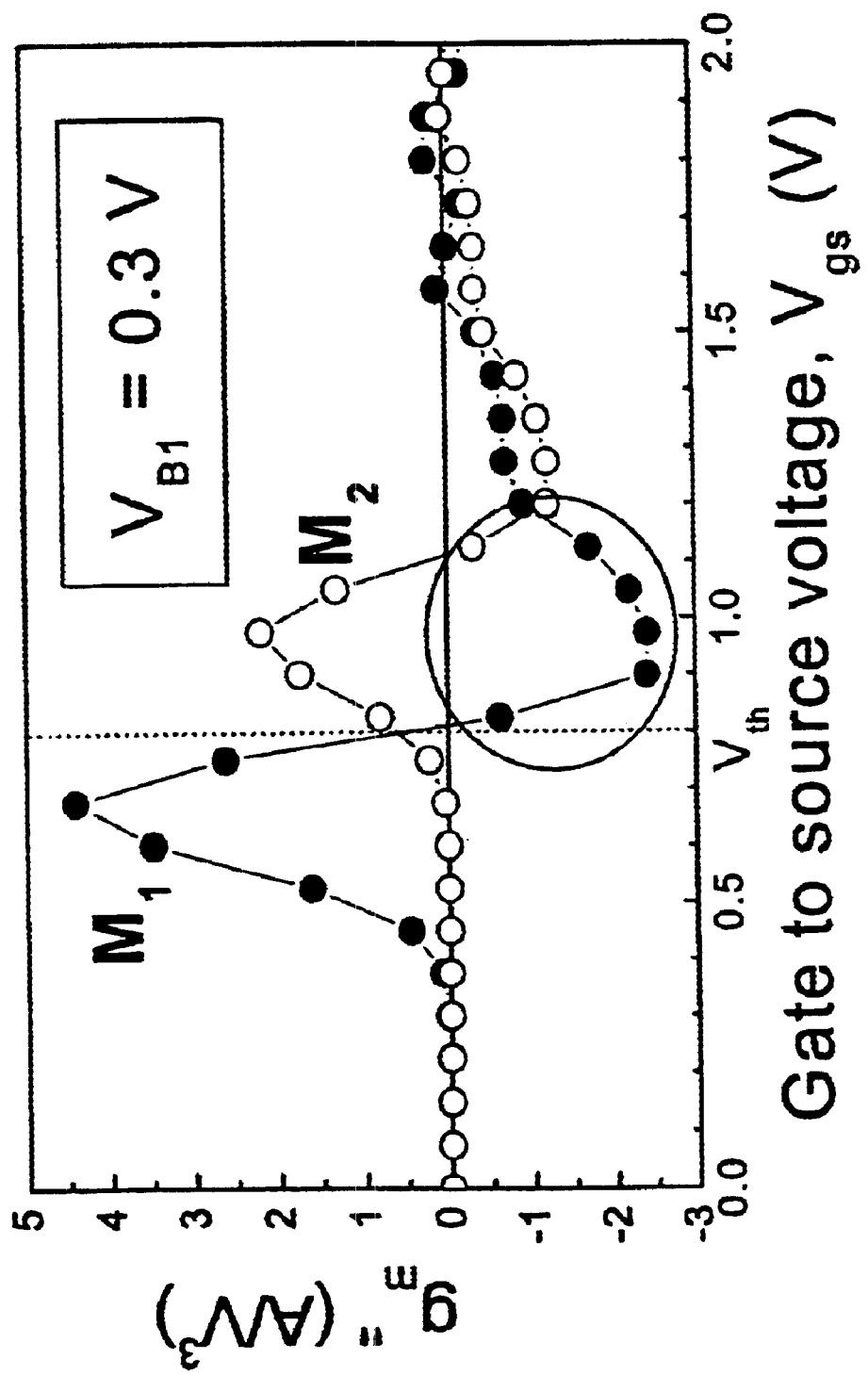
FIG. 8 shows a graph illustrating second order derivatives of trans-conductance (M1 and M2) for the main active device and the second active device (Q2) when the second active device (Q2) is biased at voltage value which corresponds to value which is resulted by subtracting the first compensation biasing voltage (Vb1) from gate to source voltage (Vgs), i.e., Vgs–Vb1.
Figure 9:
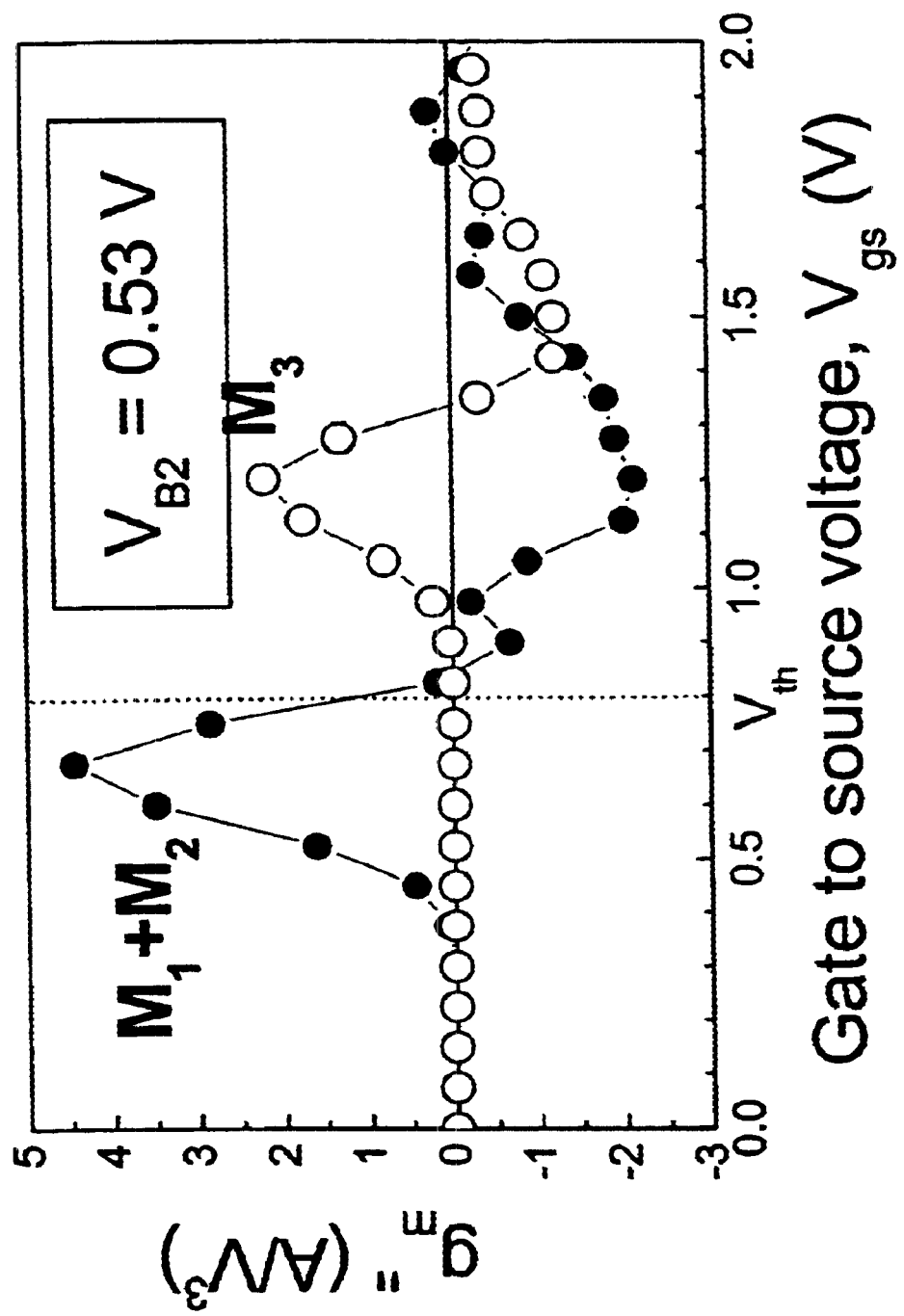
FIG. 9 shows a graph illustrating the second order derivative (gm") of trans-conductance of a circuit where the main active device (M1) and the second active device (M2) are connected in a common-source configuration where drains of the main active device (M1) and the second active device (M2) are connected to each other.

FIG. 8 shows a graph illustrating second order derivatives of trans-conductance (M1 and M2) for the main active device and the second active device (Q2) when the second active device (Q2) is biased at voltage value which corresponds to value which is resulted by subtracting the first compensation biasing voltage (Vb1) from gate to source voltage (Vgs), i.e., Vgs–Vb1. For the exemplary circuit whose graph is shown in FIG. 8, the first compensation biasing voltage (Vb1) is 0.3 V. Further, width to length ratio (W/L) for the main active device and the auxiliary active device (M1 and M2) is 6000/0.5 and 3000/0.5 ($\mu$m), respectively. The threshold voltage is 0.8 V. The compensation biasing voltage for the auxiliary active device is 0.3 V. The supplying voltage source (Vdd) is 4 V. FIG. 9 shows a graph illustrating the second order derivative (gm") of trans-conductance of a circuit where the main active device (M1) and the second active device (M2) are connected in a common-source configuration where drains of the main active device (M1) and the second active device (M2) are connected to each other.

As shown in FIG. 9, the negative minimum value in the second order derivative (gm") of trans-conductance of the main active device (M1) may not completely compensated by merely using the second order active device (M2). In this case, it is preferred that additional auxiliary active device is utilized. Preferably, the additional auxiliary active device, i.e., the second auxiliary active device, is biased at voltage value which corresponds to value which is resulted by subtracting a predetermined compensation biasing voltage, i.e., the second compensation biasing voltage (Vb2), from the gate to source voltage (Vgs), i.e., Vgs–Vb2. When an additional auxiliary active device is utilized, the second compensation biasing voltage is preferred to higher than the first compensation biasing voltage. According to another embodiment of the present invention, where the auxiliary active device is biased at a gate to source voltage value at a point where the second order derivative (gm") of trans-conductance of the auxiliary active device has positive maximum value, the second auxiliary active device may be biased at gate to source voltage value where the second order derivative (gm") of the trans-conductance of the second auxiliary active device is negative minimum.

Figure 10:
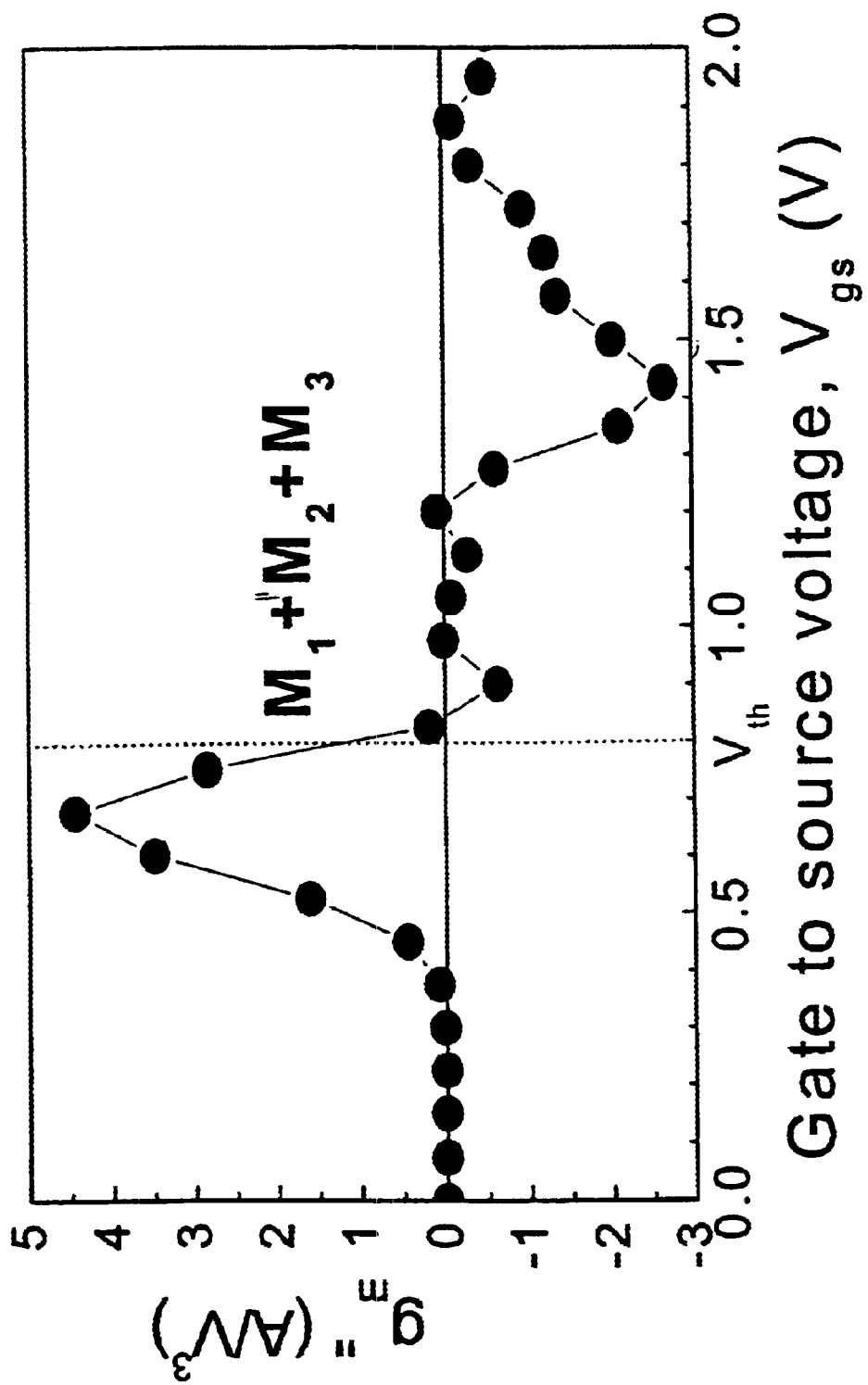
FIG. 10 shows a graph illustrating the second order derivative (gm") of trans-conductance for a circuit which has a main active device (M1), the second and third active devices (M2 and M3) being configured in the common-source configuration and, further, the drains of the active devices are connected.

FIG. 10 shows a graph illustrating the second order derivative (gm") of trans-conductance for a circuit which has a main active device (M1), the second and third active devices (M2 and M3) being configured in the common-source configuration and, further, the drains of the active devices are connected. In the embodiment shown in FIG. 10, the compensation biasing voltages of the second and third active devices are 0.3 V and 0.53 V, respectively. Further, width of the main, second, and third active devices (M1, M2, and M3) for accomplishing the compensation biasing voltages are 6000, 3000, and 3000 μm, respectively.

In order to make gm" characteristic of the main active device to be compensated by gm" characteristic of the auxiliary active device, it is preferred that real gate drive voltage, threshold voltage (Vth), gate to source voltage (Vgsn), and width to length ratio (W/L) of the auxiliary active device should be properly designed.

Actual voltage to be driven to gate of an active device is value which corresponds to value which is resulted by subtracting the threshold voltage (Vth) from gate to source voltage (Vg–Vs, Vgs).

The threshold voltage (Vth), being inherent to an active device, means voltage input to gate which represents boundary between two states where current flows and does not flow through the active device. It is possible to set the threshold voltage (Vth) to desired value by choosing proper semiconductor material and adjusting concentration of impurities to proper value. Further, threshold voltage (Vth) of an active device may be set to desired value by adjusting body voltage to proper value.

Gate to source voltage (Vgsn) of an active device may be set to desired value by adjusting either gate voltage (Vgn) or source voltage (Vsn) to proper value.

Width to length ratio (W/L) of an active device may be set to desired value by designing various parameters of a manufacturing process for the active device. It is known that the width to length ratio (W/L) of an active device is proportional to trans-conductance (gm) of the active device.

Hereinafter, a process for making a circuit comprising a main active device and a auxiliary active device is described.

It is preferred that a main active device is firstly designed. Width to length ratio (W/L) of the main active device is determined. Biasing voltage of the main active device is determined. Then, biasing circuit for accomplishing determined biasing voltage is designed.

An auxiliary active device is designed. Width to length ratio (W/L) of the auxiliary active device is determined. Preferably, the width to length ratio (W/L) is determined such that the point where maximum occurs in trans-conductance of the auxiliary active device is substantially coincident with the point where minimum occurs in trans-conductance of the main active device. Biasing voltage for the auxiliary device is determined. Then, biasing circuit for accomplishing determined biasing voltage is designed.

In accordance with embodiments of the present invention, when determining biasing voltage of the auxiliary active device, compensation biasing voltage for the auxiliary active device is adjusted such that integral of either sum, absolute value of the sum, or square of the sum of the second order derivatives of trans-conductance of the main and auxiliary active devices throughout the operational region for the entire circuit becomes minimized. Also, in accordance with further embodiment of the present invention, the point where second order derivative of trans-conductance of the auxiliary active device has maximum value may preferably be designed to substantially coincident with the point where second order derivative of trans-conductance of the main active device.

Additional auxiliary active devices may be designed in the same manner as shown above.

According to the embodiment of FIG. 1, negative value of gm" of main active device is compensated by positive value of gm" of auxiliary active device. In general, positive gm" occurs in the sub-threshold region. Therefore, the auxiliary active device operates in the sub-threshold region. Thus, the auxiliary active device consumes substantially 0 DC current. In this manner, although the present invention utilizes a plurality of auxiliary active devices in order to compensate non-linearity of a main active device, DC power consumption is almost the same as a circuit which has only a main active device. This means that non-linearity of a main active device may be suppressed without any substantial additional power consumption.

Figure 2:
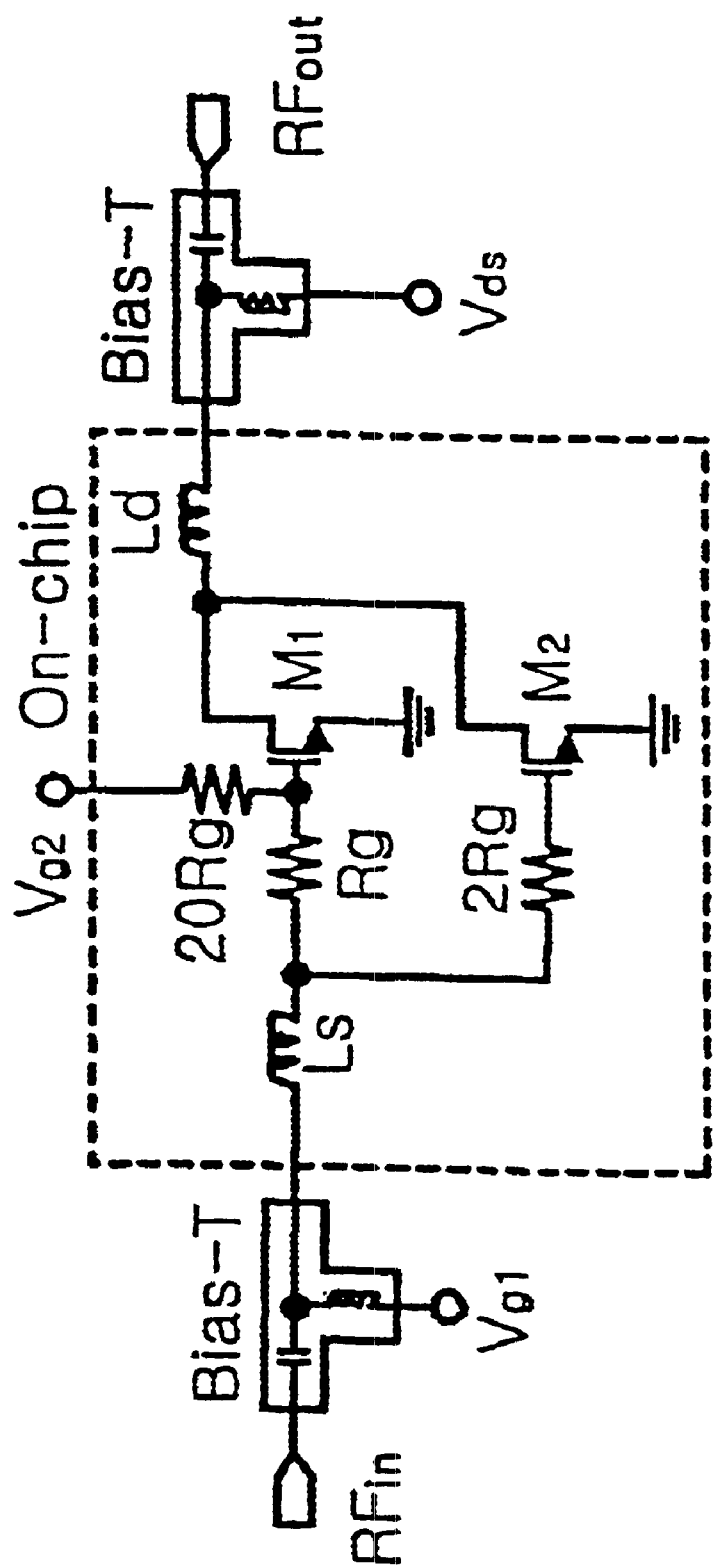
FIG. 2 shows a circuit diagram illustrating an embodiment of a common-source type amplifier circuit having improved linearity characteristic in accordance with the present invention.

Embodiment of an Amplifier Circuit of Common-Source Configuration Having Improved Linearity Characteristic in accordance with the Present Invention FIG. 2 shows a circuit diagram illustrating an embodiment of a common-source type amplifier circuit having improved linearity characteristic in accordance with the present invention.

As shown in FIG. 2, the common-source type amplifier circuit according to the present invention comprises a main active device (M1) and an auxiliary active device (M2). Sources of the main and auxiliary active devices (M1 and M2) are connected to the ground.

Input terminal (Rfin) is connected to an input-side biasing unit. The input-side biasing unit is connected to gates of the main and auxiliary active devices (M1 and M2). The input-side biasing unit comprises T-type biasing unit (Bias-T). The T-type biasing unit (Bias-T) comprises a capacitor and an inductor connected between the input terminal and the first voltage source (Vg1). The input-side biasing unit further comprises an inductor (Ls), an end of which is connected to the connecting point of the capacitor and the inductor, the first resistor (Rg) connected between the other end of the inductor (Ls) and gate of the main active device (M1), the second resistor (2Rg) connected between the other end of the inductor (Ls) and the gate of the main active device (M1), and the third resistor (20Rg) connected between the second voltage source and the gate of the main active device (M1).

The first resistor (Rg) acts to enhance the stability of operation of the active devices. The first resistor (Rg) further acts as biasing circuit. The first resistor (Rg) acts as a substitute for a conventional large DC decoupling capacitor at the input side, which usually has small Q value.

In accordance with the embodiment shown in FIG. 2, output-side biasing units are provided between drains of the main and auxiliary active devices (M1 and M2) and the output terminal. The output-side biasing unit comprises an inductor (Ld), one end of which is connected to the drains of the active devices and T-type biasing unit which is connected between the other end of the inductor (Ld) and the output terminal (RFout). The T-type biasing unit comprises a capacitor connected between the other end of the inductor (Ld) and the output terminal and an inductor connected between the other end of the inductor (Ld) and the third voltage source (Vds).

In the embodiment shown in FIG. 2, the main active device (M1) amplifies signal from the input terminal by the common-source mode amplification and provides the amplified signal to the output terminal. The auxiliary active device (M2) acts to compensate non-linear operation of the main active device (M1).

Actual parameter values for an exemplary circuit of FIG. 2 will be set forth. The parameter values were designed based on 0.5 µm N-well CMOS technology. Width to length ratio of the main and auxiliary active devices (M1 and M2) is 600/0.5 and 300/0.5, respectively. Resistor value for the second and third resistors may be approximately 2 times and 20 times of the value of the first resistor. The supply voltage (Vg1 and Vg2) provided to the biasing units may be Vg1=Vgs−VB1 and Vg2=Vgs+20VB1, respectively. The first compensation biasing voltage (VB1) is 0.38 V. Biasing resistor (Rg) has resistor value of 40Ω. The gate voltage to the main active device is Vgs. The gate voltage to the auxiliary active device is Vgs−VB1.

Figure 3:
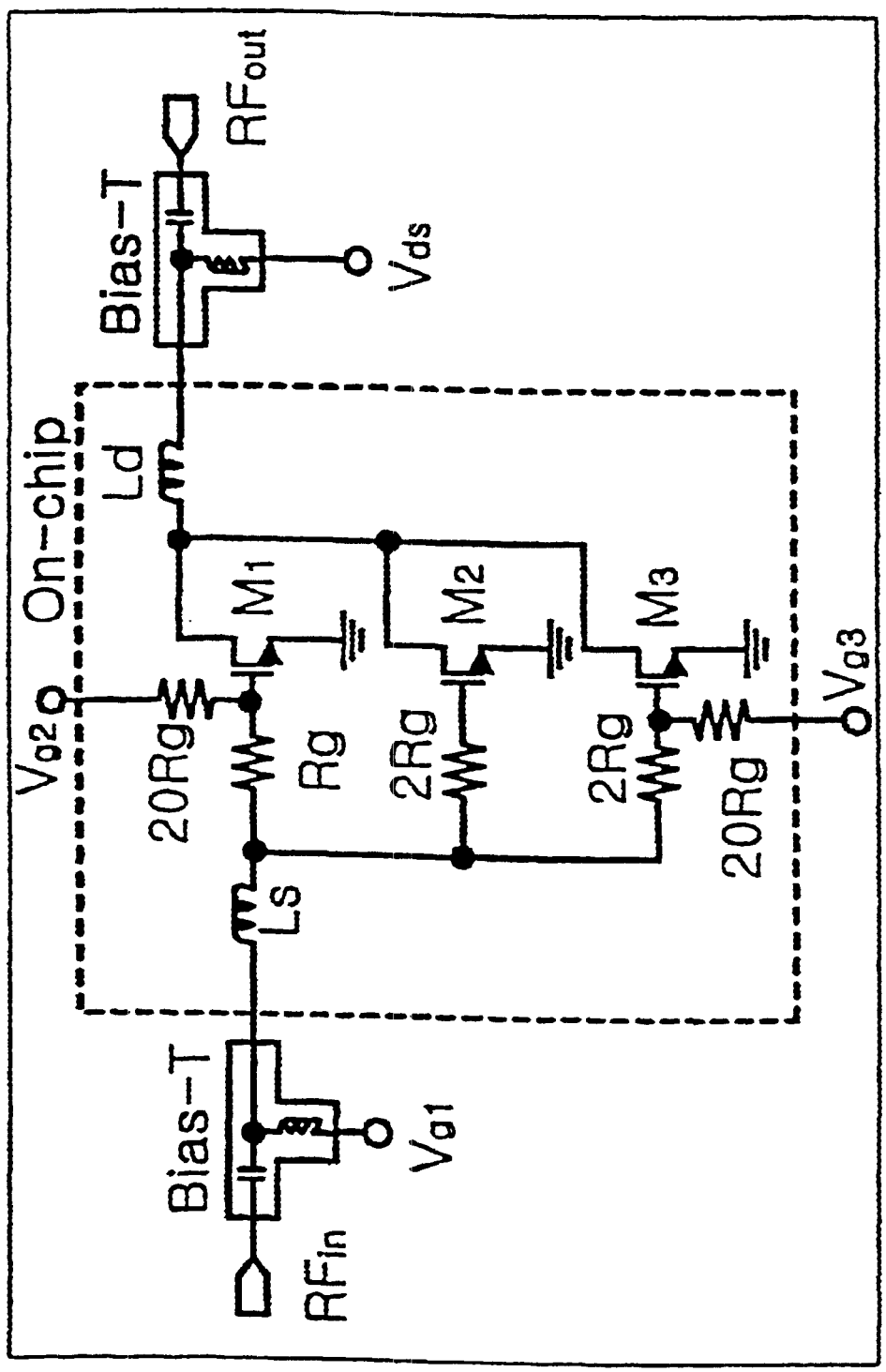
FIG. 3 shows a circuit diagram illustrating another embodiment of a common-source type amplification circuit according to the present invention.

FIG. 3 shows a circuit diagram illustrating another embodiment of a common-source type amplification circuit according to the present invention.

Actual parameter values for an exemplary circuit of FIG. 3 will be set forth. The parameter values were designed based on 0.5 µm N-well CMOS technology. Width to length ratio of the main, second and third auxiliary active devices (M1, M2, and M3) is 600/0.5, 300/0.5, and 280/0.5, respectively. Resistor value for the second and third resistors may be approximately 2 times and 20 times of the value of the first resistor. Resistor value for the resistor connected to gate of the third active device (M3) may be approximately 2 times of the value of the first resistor. The supply voltage (Vg1, Vg2, and Vg3) provided to the biasing units may be Vg1=Vgs−VB1, Vg2=Vgs+20VB1, and Vg3=Vgs+20VB1−21VB, respectively. The first compensation biasing voltage (VB1) is 0.38 V. Biasing resistor (Rg) has resistor value of 40Ω. The gate voltage to the main active device is Vgs. The gate voltage to the auxiliary active devices is Vgs−VB1 and Vgs−VB2, respectively.

Figure 4:
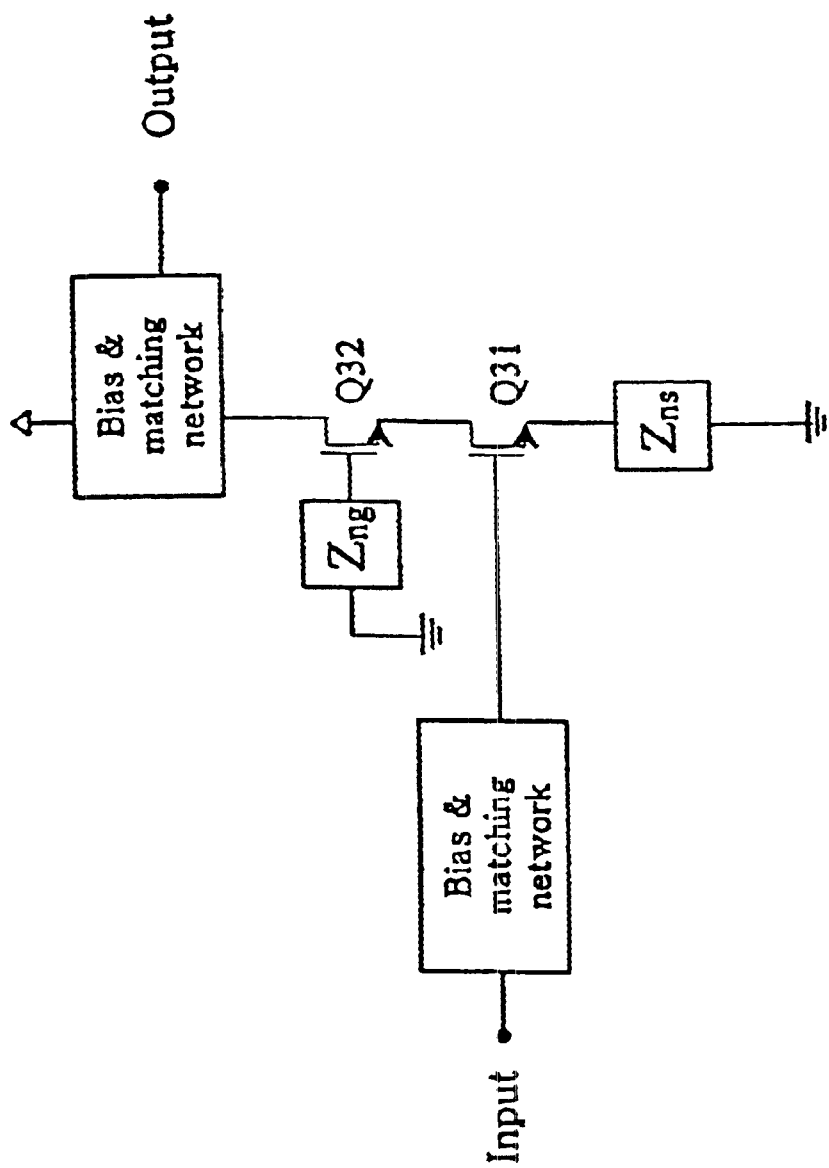
FIG. 4 shows a circuit diagram illustrating a convention cascode type amplifier circuit.

Embodiment of an Amplifier Circuit of Cascode Configuration Having Improved Linearity Characteristic in accordance with the Present Invention FIG. 4 shows a circuit diagram illustrating a convention cascode type amplifier circuit. At first, constitution and operation of the circuit of FIG. 4 will be described.

In accordance with FIG. 4, the first and second active devices (Q31 and Q32) are serially connected such that drain of the first active device (Q31) is coupled to source of the second active device (Q32). Coupling of the drain of the first active device (Q31) and the source of the second active device (Q32) should be interpreted in a broad sense such that it includes connection by wiring and coupling via capacitor, i.e., capacitor coupling.

Source of the first active device (Q31) is connected to the ground through an impedance unit. Here, the impedance unit should be interpreted in a broad sense such that the impedance value includes real and complex value. Moreover, the impedance unit can have their impedance value of 0 or infinite value. In general, the impedance is preferred to be designed such that it has large value when operating on DC state and small value when operating on AC state. Gate (Ng) of the first active device (Q31) is connected to an input terminal through an input-side biasing circuit and a matching circuit.

Gate of the second active device (Qn32) is connected to the ground through an impedance unit. Drain is connected to the first voltage source, e.g., positive (+) voltage source, through biasing and matching circuits. Preferably, the positive voltage source is a source for supplying power having standard voltage value of 3 V or 5 V.

Input signal is provided to gate (Ng) of the first active device (Q31) through the biasing and matching circuits from the input terminal. Drain (Nd) of the second active device (Q32) is connected to an output terminal through biasing and matching circuits.

The circuit of FIG. 4 has merits over the common-source type amplifier circuit as follows.

Miller capacitance between gate and drain of an active device may be diminished. Therefore, frequency characteristic of an amplifier circuit may be improved. Further, output impedance from drain of an active device is increased. Therefore, output gain acquired by connecting a load to the drain may be increased. When the circuit of FIG. 4 is used for a low noise amplifier, effect of output signal on the input stage may be suppressed. In other words, reverse isolation problem is improved. In general, such reverse isolation problem is important factor in designing a direct conversion receiver. Therefore, cascode type amplifiers have been widely used in RF band applications.

Figure 5:
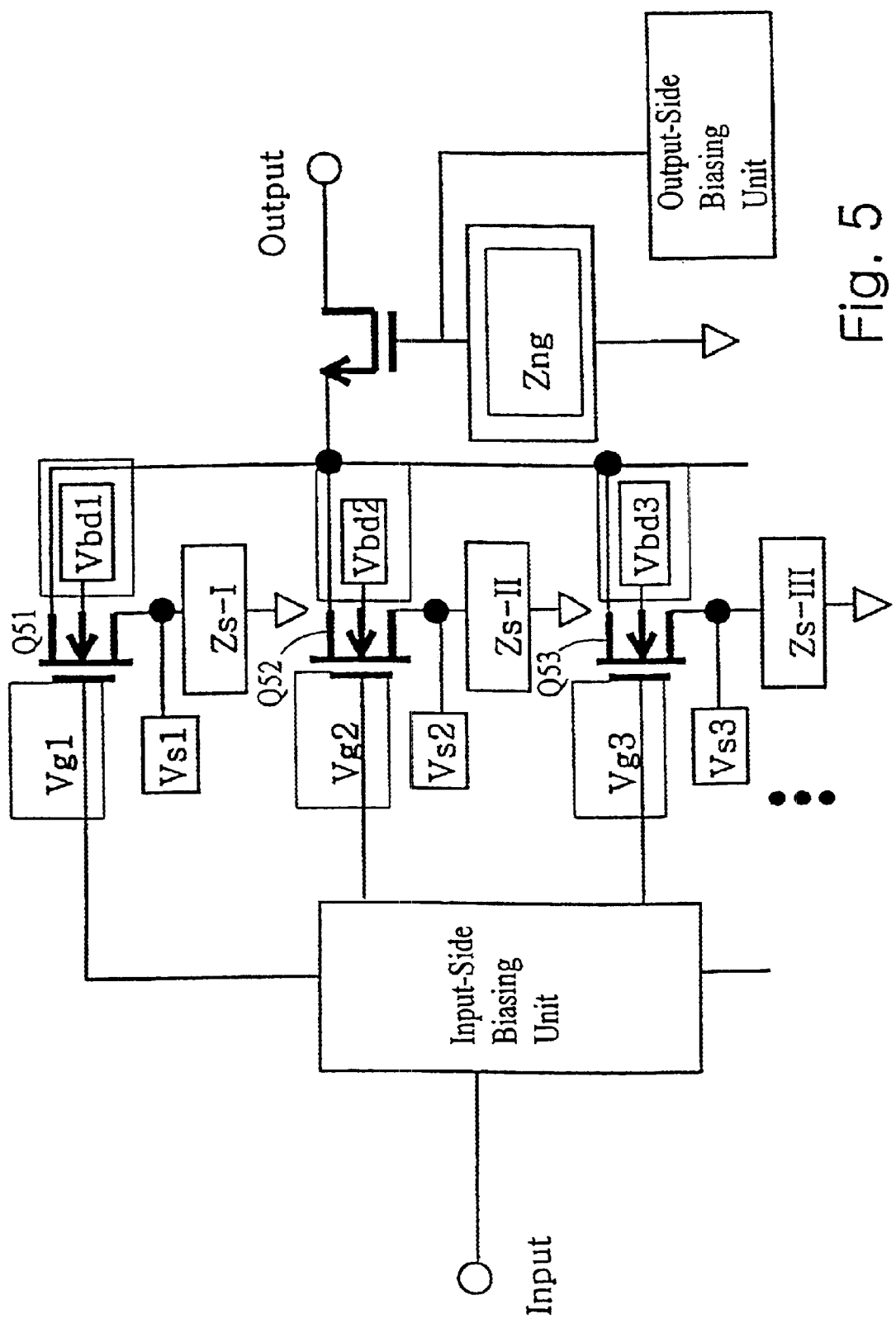
FIG. 5 shows a circuit diagram illustrating an embodiment of a cascode type amplifier circuit having improved linearity characteristic in accordance with the present invention.

FIG. 5 shows a circuit diagram illustrating an embodiment of a cascode type amplifier circuit having improved linearity characteristic in accordance with the present invention.

In comparison with the configuration of conventional cascode type amplifier circuit of FIG. 4, the circuit of FIG. 5 has the first active device be exchanged with an amplifier circuit having improved linearity in accordance with the present invention. The circuit of FIG. 5 includes active devices Q51, Q52 and Q53. The circuit of FIG. 5 also includes Input-Side Biasing Unit and Output-Side Biasing Unit. The circuit of FIG. 5 may be acquired by connecting the output terminal of the circuit of FIG. 1 to source of the second active device of the circuit of FIG. 5.

According to a further embodiment of the present invention, for the output stage in the circuit of FIG. 5, a bipolar junction transistor (BJT) may be used instead of the MOSFET. In this case, the circuit may be modified such that each of base, emitter, and collector of a BJT corresponds to gate, source, and drain of the MOSFET, respectively.

Figure 11:
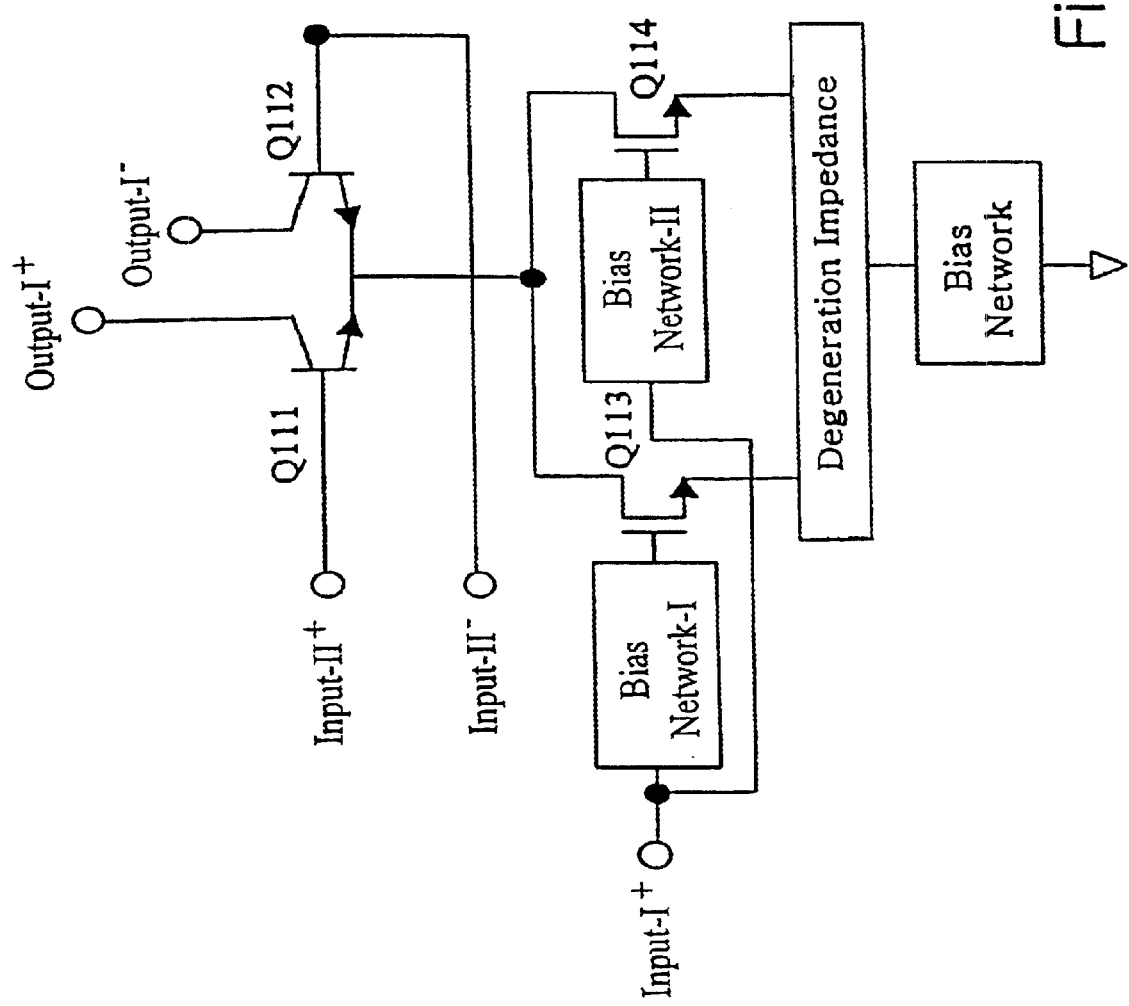
FIG. 11 shows a circuit diagram illustrating a single balanced mixer circuit having improved linearity in accordance with the present invention.

Embodiment of Single and Double Balanced Mixer Circuits Having Improved Linearity Characteristic in accordance with the Present Invention FIG. 11 shows a circuit diagram illustrating a single balanced mixer circuit having improved linearity in accordance with the present invention.

According to FIG. 11, in addition to a single balanced mixer circuit comprising a pair of BJTs (Q111 and Q112) whose emitters are coupled and a main active device (Q113) whose drain is connected to both emitters of the BJT pair, the circuit further comprises an auxiliary active device (Q114) whose drain is connected to the drain of the main active device (Q113). The auxiliary active device (Q114) acts to compensate non-linearity of the main active device (Q113). The BJT pair may also be called a differential pair.

Both of the bases of the differential pair (Q111 and Q112) are connected to the first input terminal (Input-II[30] and Input-II[−]) through biasing and matching circuits. Source of the main active device (Q113) is connected to the ground through an impedance unit. (Degeneration Impedance) Gate (Ng) is connected to the second input terminal through (Input-I$^{30}$) through input-side biasing and matching circuits (Bias Network-I). Collectors of the differential pair (Q111 and Q112) are connected to an output terminal (Output-I$^{30}$ and Output-I$^{31}$ through biasing and matching circuit.

Source of auxiliary active device (Q114) is connected to the ground through an impedance unit (Degeneration Impedance). Drain is connected to the drain of the main active device (Q113). The gate of the auxiliary active device (Q114) is connected to the second input terminal (Input-I$^{30}$) through input-side biasing and matching circuits (Bias Network-II.

In accordance with the circuit of FIG. 11, non-linearity of the main active device (Q113) could be compensated by using the auxiliary active device (Q114).

Figure 12:
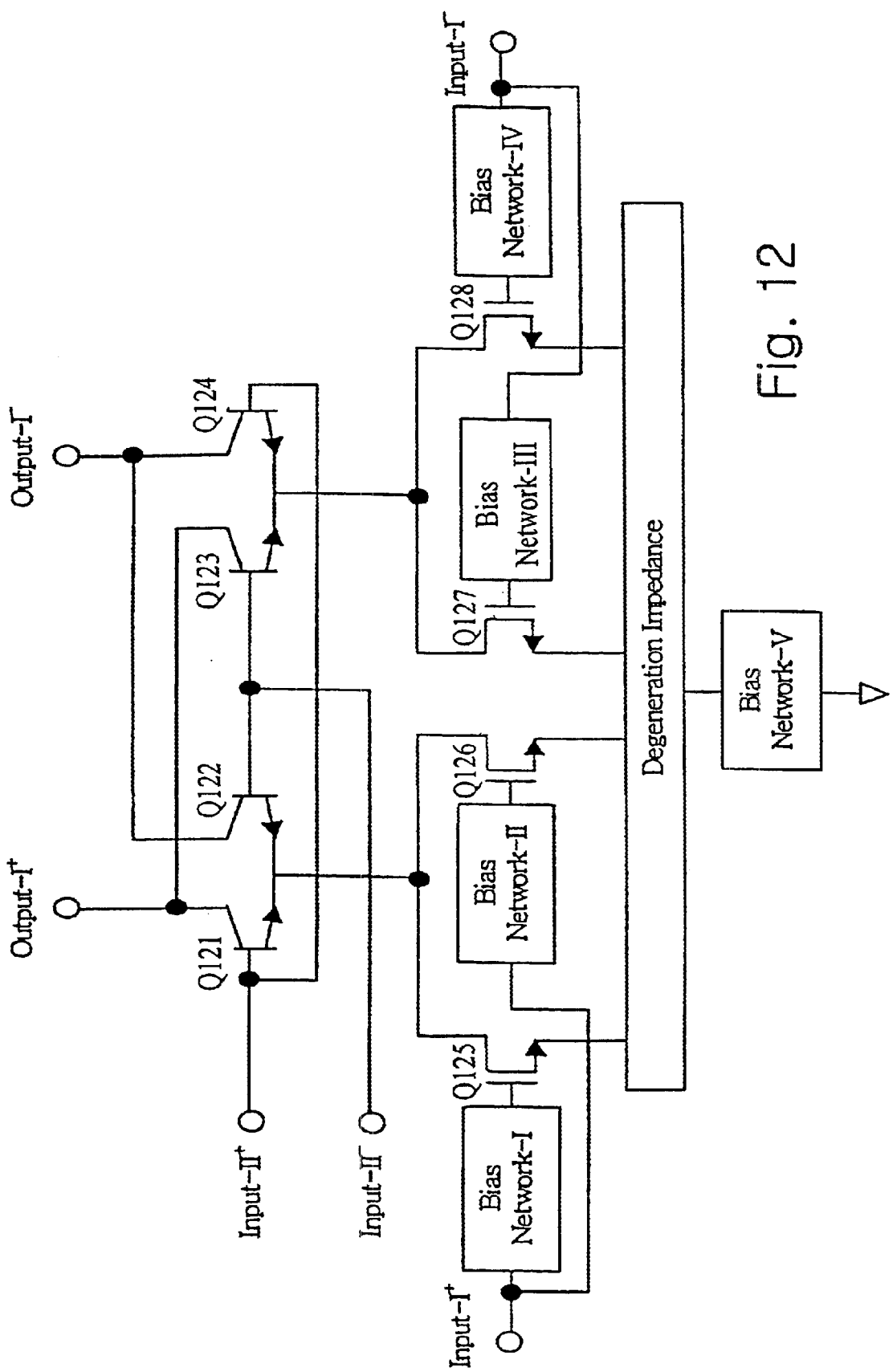
FIG. 12 shows a circuit diagram illustrating a double balanced mixer circuit in accordance with the present invention.
Figure 13:
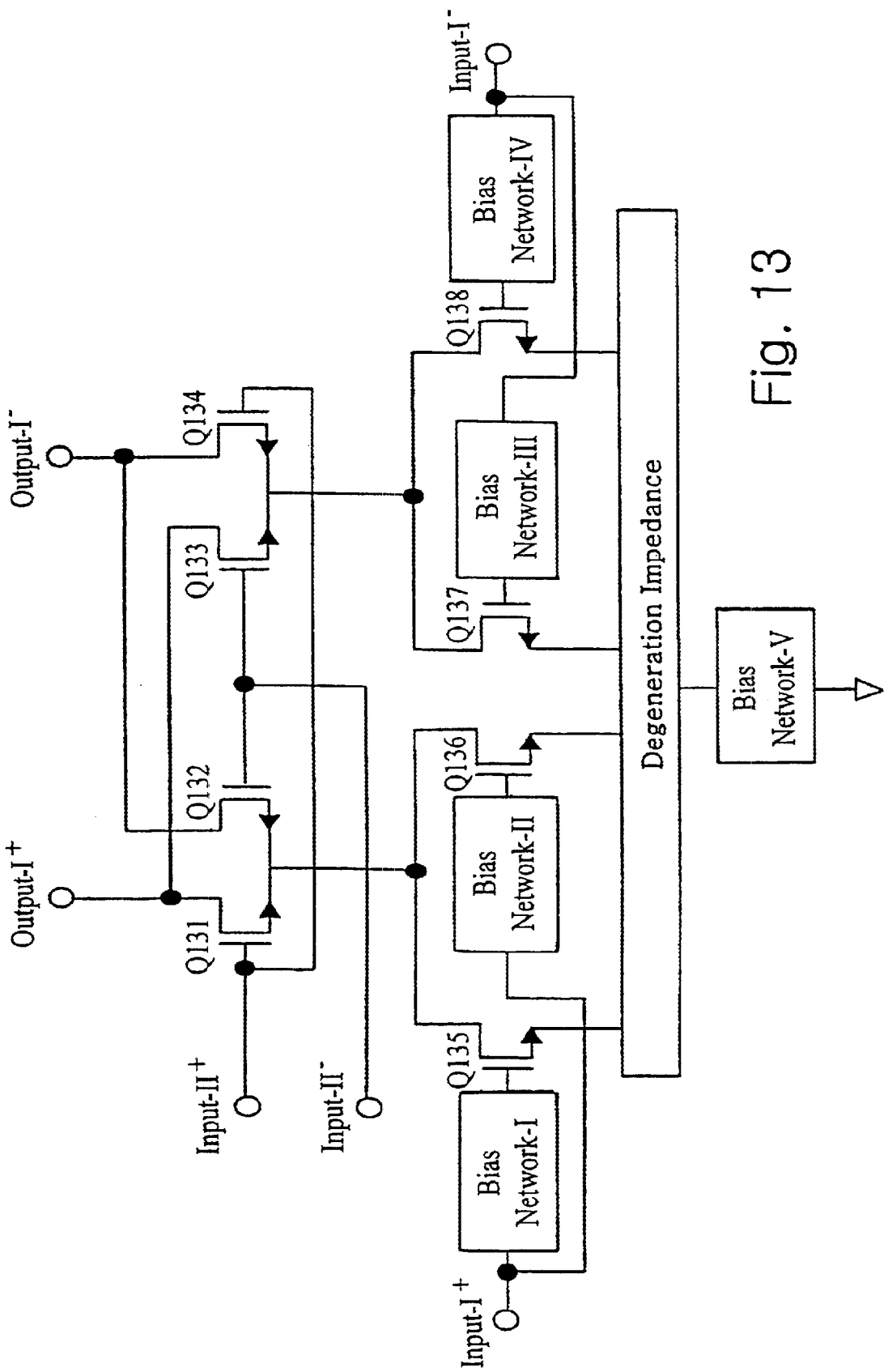
FIG. 13 shows a circuit diagram illustrating a circuit where the differential pairs in FIG. 12 is comprised of MOSFETs.

FIG. 12 shows a circuit diagram illustrating a double balanced mixer circuit in accordance with the present invention. FIG. 13 shows a circuit diagram illustrating a circuit where the differential pairs in FIG. 12 is comprised of MOSFETs. The circuits of FIGS. 12 and 13 have advantage that non-linearity is substantially suppressed in accordance with the present invention as shown above. The double balanced mixer circuit of FIG. 12 includes differential pairs of BJTs (Q121-Q122 and Q123-Q124). The collectors of the pairs of BJTs are connected to an output terminal (Output-I$^{30}$ and Output-I$^{31}$). The bases of the pairs of BJTs are connected to a first input terminals (Input-II$^{30}$ and Input-II$^{31}$). The double balanced mixer circuit of FIG. 12 also includes active devices Q125, Q126, Q127 and Q128. The emitters of the BJT pair Q121-Q122 are connected to the drains of the active devices Q125 and Q126. The emitters of the BJT pair Q123-Q124 are connected to the drains of the active devices Q127 and Q128. The gates of the active devices Q125, Q126, Q127 and Q128 are connected to the second input terminal (Input-I$^{30}$ and Input-I$^{31}$) through input side biasing and matching circuits (Bias Network-I, Bias Network-II, Bias Network-III and Bias Network-IV, respectively). The source of the active devices Q125, Q126, Q127 and Q128 are connected to the ground through an impedance unit (Degeneration Impedance) and Bias Network-V. The double balanced mixer circuit of FIG. 13 is similar to the double balanced mixer circuit of FIG. 12, except that the differential pairs of BJTs (Q121-Q122 and Q123-Q124) of FIG. 12 are replaced with differential pairs of MOSFETs (Q131-Q132 and Q133-Q134) in FIG. 13. The double balanced mixer circuit of FIG. 13 also includes active devices Q135, Q136, Q137 and Q138 corresponding to the active devices Q125, Q126, Q127 and Q128 of FIG. 12.

In accordance with the present invention, non-linearity of an active device, which is used as an amplification stage, may be suppressed.

An auxiliary active device for compensating non-linearity of the active device consumes substantially zero DC current. Therefore, although the present invention uses additional active device for the compensation of non-linearity, additional power consumption is not required in comparison with the original circuit which does not uses the additional active device. Conclusively, according to the present invention, non-linearity of a main active device is suppressed without further consumption of DC power.

What is claimed is:

1. An amplifier circuit comprising:
  a main active device having a first, a second, and a third terminal, wherein quantity and direction of current flowing from the second terminal to the third terminal varies depending on voltage driven to the first terminal;
  an auxiliary active device having a first, a second, and a third terminal, wherein quantity and direction of current flowing from the second terminal to the third terminal varies depending on voltage driven to the first terminal;
  a main biasing unit connected to the first terminal of said main active device, the third terminal of said main active device, voltage source, an input terminal, and an output terminal, by which said main active device operates primarily in a saturation region; and
  an auxiliary biasing unit connected to the first terminal of said auxiliary active device, the third terminal of said auxiliary active device, voltage source, an input terminal, and an output terminal, by which said auxiliary active device operates primarily in sub-threshold region.

2. The amplifier circuit of claim 1, wherein said main active device acquires a trans-conductance value high enough such that the trans-conductance value is substantially the same as the value, to which the trans-conductance of said main active device converges as voltage between the first and second terminal is increased.

3. The amplifier circuit of claim 1, wherein said main active device is biased such that the difference between a voltage between the first and second terminals of said main active device and a voltage between the first and second terminals of said auxiliary active device is substantially equal to a predetermined value.

4. The amplifier circuit of claim 1, wherein the second terminals of said main and auxiliary active devices are connected to ground.

5. The amplifier circuit of claim 1, wherein each of said main and auxiliary active devices further has a fourth terminal for changing threshold voltage of each of said main and auxiliary active devices, respectively, and said main and auxiliary biasing units are connected to the fourth terminals of the main and auxiliary biasing units, respectively.

6. The amplifier circuit of claim 1, wherein said main and auxiliary active devices are MOSFETs, and each of the first, second, and third terminals is a gate, a source, and a drain terminal, respectively.

7. The amplifier circuit of claim 1 further comprising second auxiliary active device having a first, a second, and a third terminal, wherein quantity and direction of current flowing from the second terminal to the third terminal varies depending on voltage driven to the first terminal, which operates primarily in a sub-threshold region by said biasing unit, and
  said auxiliary biasing unit is connected to the first and third terminals of said second auxiliary active device.

8. A compensation circuit for compensating non-linearity of a main active device having a first, a second, and a third terminal, wherein a quantity and direction of current flowing from the second terminal to the terminal varies depending on voltage driven to the first terminal, comprising;
  an auxiliary active device having a first, a second, and a third terminal, wherein a quantity and direction of current flowing from the second terminal to the terminal varies depending on voltage driven to the first terminal; and
  a biasing unit connected to the first terminal of said auxiliary active device, the third terminal of said auxiliary active device, voltage source, an input terminal, and an output terminal, by which said auxiliary active device operates primarily in a sub-threshold region under a condition that said main active device operates primarily in a saturation region.

9. The compensation circuit of claim 8, wherein said auxiliary active device further has a fourth terminal for changing a threshold voltage of said auxiliary active device, and said biasing unit is connected to the fourth terminal.

10. The compensation circuit of claim 1, wherein said auxiliary active device is a MOSFET, and each of the first, second, and third terminals is a gate, a source, and a drain terminal, respectively.

11. The compensation circuit of claim 8 further comprising a second auxiliary active device having a first, a second, and a third terminal, wherein a quantity and direction of current flowing from the second terminal to the third terminal varies depending on voltage driven to the first terminal, which operates primarily in a sub-threshold region by said biasing unit, and said biasing unit is connected to the first and third terminal of said second auxiliary active device.

12. An amplifier circuit comprising:

first and second main active devices each having a first, a second, and a third terminal, wherein quantity and direction of current flowing from the second terminal to the third terminal varies depending on voltage driven to the first terminal, and said first and second main active devices are serially coupled such that the third terminal of said first main active device is coupled to the second terminal of said second main active device;

an auxiliary active device having a first, a second, and a third terminal, wherein quantity and direction of current flowing from the second terminal to the third terminal varies depending on voltage driven to the first terminal, and the third terminals of said first main active device and said auxiliary active device are connected; and a biasing unit connected to the first terminals of said first and second main active devices, the first terminal of said auxiliary active devices, the third terminal of said second main active device, voltage source, an input terminal, and an output terminal, by which said first and second main active devices operate primarily in a saturation region and said auxiliary active device operates primarily in a sub-threshold region.

13. The amplification circuit of claim 12 further comprising a second auxiliary active device having a first, a second, and a third terminal, wherein a quantity and direction of current flowing from the second terminal to the third terminal varies depending on voltage driven to the first terminal, which operates primarily in a sub-threshold region by said biasing unit, and said biasing unit is connected to the first and third terminals of said second auxiliary active device.

14. The amplifier circuit of claim 12, wherein each of said first main and auxiliary active devices further has a fourth terminal for changing a threshold voltage of each of said main and auxiliary active devices, respectively, and said biasing unit is connected to the fourth terminals.

15. The amplifier circuit of claim 12, wherein said first main and auxiliary active device are MOSFET, and each of the first, second, and third terminals is a gate, a source, and a drain terminal, respectively.

16. A mixer circuit comprising:

a main active device having a first, a second, and a third terminal, wherein quantity and direction of current flowing from the second terminal to the third terminal varies depending on voltage driven to the first terminal, an active device pair comprising two active devices, each having a first, a second, and a third terminal, wherein quantity and direction of current flowing from the second terminal to the third terminal varies depending on voltage driven to the first terminal, and wherein said main active device and said active device pair are serially coupled such that the third terminal of said main active device is coupled to the second terminals of said active devices in said active device pair;

an auxiliary active device having a first, a second, and a third terminal, wherein quantity and direction of current flowing from the second terminal to the third terminal varies depending on voltage driven to the first terminal, and the third terminals of said first main active device and said auxiliary active device are connected; and a biasing unit connected to the first terminals of said main active device and the active devices in said active device pair, the first terminal of said auxiliary active device, voltage source, and input terminal, and an output terminal, by which said main active device operates primarily in a saturation region and said auxiliary active device operates primarily in a sub-threshold region.

17. The mixer circuit of claim 16, wherein each of said main and auxiliary active devices further has a fourth terminal for changing a threshold voltage of each of said main and auxiliary active devices, respectively, and said biasing unit is connected to the fourth terminals.

18. The mixer circuit of claim 16, wherein said main and auxiliary active devices are MOSFETs and each of the first, second, and third terminals is a gate, a source, and a drain terminal, respectively.

* * * * *